US008860607B2

United States Patent
Shamim et al.

(10) Patent No.: US 8,860,607 B2
(45) Date of Patent: Oct. 14, 2014

(54) GAIN ENHANCED LTCC SYSTEM-ON-PACKAGE FOR UMRR APPLICATIONS

(75) Inventors: Atif Shamim, Thuwal (SA); Farhan Abdul Ghaffar, Thuwal (SA); Muhammad Umair Khalid, Lahore (PK); Khaled Nabil Salama, Thuwal (SA)

(73) Assignee: King Abdullah University of Science and Technology, Thuwal (SA)

( * ) Notice: Subject to any disclaimer, the term of this patent is extended or adjusted under 35 U.S.C. 154(b) by 247 days.

(21) Appl. No.: 13/205,935

(22) Filed: Aug. 9, 2011

(65) Prior Publication Data

US 2012/0032836 A1   Feb. 9, 2012

Related U.S. Application Data

(60) Provisional application No. 61/371,952, filed on Aug. 9, 2010.

(51) Int. Cl.
| | | |
|---|---|---|
| *G01S 13/00* | (2006.01) | |
| *H01Q 15/08* | (2006.01) | |
| *H01L 23/15* | (2006.01) | |
| *H01Q 19/06* | (2006.01) | |
| *G01S 7/03* | (2006.01) | |
| *H01L 23/13* | (2006.01) | |
| *H01Q 21/06* | (2006.01) | |
| *H01L 23/538* | (2006.01) | |

(52) U.S. Cl.
CPC  *G01S 7/03* (2013.01); *H01Q 15/08* (2013.01); *H01L 23/15* (2013.01); *H01Q 19/062* (2013.01); *H01L 2924/09701* (2013.01); *H01L 23/13* (2013.01); *H01Q 21/065* (2013.01); *H01L 23/5389* (2013.01)
USPC ................................ 342/175; 342/70; 342/27

(58) Field of Classification Search
CPC ....................................................... G01S 7/032
USPC ............................................. 342/27, 70, 175
See application file for complete search history.

(56) References Cited

U.S. PATENT DOCUMENTS 6,501,415 B1 * 12/2002 Viana et al. ..................... 342/27
6,809,692 B2 * 10/2004 Puente Baliarda et al. ... 343/713

(Continued)

FOREIGN PATENT DOCUMENTS

WO   2010051217   5/2010

OTHER PUBLICATIONS

Kaymaram, F.; Shafai, L., "Enhancement of microstrip antenna directivity using double-superstrate configurations," Electrical and Computer Engineering, Canadian Journal of , vol. 32, No. 2, pp. 77,82, Spring 2007.*

(Continued)

*Primary Examiner* — John B Sotomayor
*Assistant Examiner* — Marcus Windrich
(74) *Attorney, Agent, or Firm* — Thomas|Horstemeyer, LLP

(57) ABSTRACT

An apparatus, system, and method for Gain Enhanced LTCC System-on-Package radar sensor. The sensor includes a substrate and an integrated circuit coupled to the substrate, where the integrated circuit is configured to transmit and receive radio frequency (RF) signals. An antenna may be coupled to the integrated circuit and a lens may be coupled to the antenna. The lens may be configured to enhance the gain of the sensor.

50 Claims, 8 Drawing Sheets

(56) References Cited

U.S. PATENT DOCUMENTS

| | | | |
|---|---|---|---|
| 7,733,265 B2* | 6/2010 | Margomenos et al. | 342/70 |
| 8,022,861 B2* | 9/2011 | Margomenos | 342/70 |
| 8,256,685 B2* | 9/2012 | Chen et al. | 235/492 |
| 2002/0057220 A1 | 5/2002 | Sabet et al. | |
| 2006/0033664 A1 | 2/2006 | Castany et al. | |
| 2007/0216587 A1* | 9/2007 | Schmidt et al. | 343/711 |
| 2010/0277374 A1* | 11/2010 | Ju et al. | 343/700 MS |

OTHER PUBLICATIONS

Petosa, A.; Ittipiboon, A., "Design and performance of a perforated dielectric fresnel lens," Microwaves, Antennas and Propagation, IEE Proceedings, vol. 150, No. 5, pp. 309,314, Oct. 10, 2003.*

Holzwarth et al., "Integrated stacked patch antenna array on LTCC material operating at 24 GHz [automotive radar applications]," *IEEE Antennas and Propagation Society International Symposium*, 2:1583-1586, 2004.

Kadri et al., "Ka-band Fresnel Lens Antenna Fed with an Active Linear Microstrip Patch Array," *IEEE Transactions on Antennas and Propagation*, vol. 53, pp. 4175-4178, Dec. 2005.

Petosa et al., "Design and Performance of a Perforated Dielectric Fresnel Lens," *IEEE Proceedings—Microwaves, Antennas and Propagation*, vol. 148, pp. 309-314, Oct. 2003.

Petosa et al., "Shadow Blockage Effects on the Aperture Efficiency of Dielectric Fresnel Lens," *IEEE Proceedings—Microwaves, Antennas and Propagation*, vol. 147, pp. 451-454, Dec. 2000.

Uhlig et al., "LTCC short range radar sensor for automotive applications at 24 GHz," *37 IMAPS*, Long Beach, California, pp. 1-5. Nov. 2004.

International Search Report and Written Opinion in Application No. PCT/IB2011/002611 dated Mar. 8, 2012, 18 pages.

Ghaffar, et al., "Gain-Enhanced LTCC System-on-Package for Automotive UMRR Applications", Electrical Engineering Program, King Abdullah University of Science and Technology (Kaust; Thuwal, Saudi Arabia), 2010 IEEE, Aug. 1, 2010, pp. 934-937.

Lamminen, et al., "60-GHz Patch Antennas and Arrays on LTCC With Embedded-Cavity Substrates", IEEE Transactions on Antennas and Propagation, vol. 56, No. 9, Sep. 1, 2008, pp. 2865-2874.

Liu, et al., "An LTCC Superstrate Patch Antenna for 60-GHz Package Applications", IBM Thomas J. Watson Research Center, Yorktown Heights, NY, 2010 IEEE, Jul. 11, 2010, 4 pages.

Alexopoulos, et al., "Fundamental Superstrate (Cover) Effects on Printed Circuit Antennas", IEEE Transactions on Antennas and Propagation, vol. AP-32, No. 8, Aug. 1, 1984, pp. 807-816.

Werner, et al., "An Overview of Fractal Antenna Engineering Research", IEEE Antennas and Propagation Magazine, vol. 45, No. 1, Feb. 1, 2003, pp. 38-57.

Petosa, et al., "Design and Performance of a Perforated Dielectric Fresnel Lens", IEE Proc.-Microw. Antennas Propag., vol. 150, No. 5, Oct. 2003, pp. 309-314.

* cited by examiner

GAIN ENHANCED LTCC SYSTEM-ON-PACKAGE FOR UMRR APPLICATIONS

CROSS-REFERENCE TO RELATED APPLICATIONS

This application claims priority to U.S. Provisional Application No. 61/371,952 filed Aug. 9, 2010, the entire contents of which is specifically incorporated by reference herein without disclaimer.

BACKGROUND OF THE INVENTION

1. Field of the Invention

This invention relates to Universal Medium Range Radar (UMRR) and more particularly relates to an apparatus, system, and method for gain enhanced Low Temperature Co-fired Ceramic (LTCC) system-on-package for UMRR applications.

2. Description of the Related Art

Ever since the introduction of the first short range radar (SRR) system in the 2005 Mercedes S class, interest in the automotive radar applications at the unlicensed 24 GHz (Industrial, Scientific and Medical) band has been gathering a great deal of momentum with an increasing number of applications being envisaged. The Universal Medium Range Radar (UMRR) is one such example, which operates in the 24 GHz band, and is generally utilized for advanced automotive driver assistance applications such as high-precision parking aid, blind spot detection, and high sensitivity pre-crash detection. In addition, UMRR can be employed as a support for cut-in, stop and go situations, and in Adaptive Cruise Control (ACC) systems. However, the above mentioned radar applications are still limited to expensive vehicles due to their high cost implementations.

The System-on-Package (SoP) platform integrates multiple functions into a single, compact, low cost and high performance packaged module. It reduces the system size and cost immensely by transforming millimeter-scale discrete components into micrometer or nanometer-scaled embedded thin-film components. Within the SoP technology domain, LTCC technology offers many attractive features and possibilities such as an arbitrary number of layers, which not only allows for embedded passives, but also facilitates their vertical integration with other RF components. An LTCC based automotive radar system at 24 GHz has been demonstrated. However, it employs an eight-patch antenna array with a complex feed network, which renders the system bulky, inefficient, and poorly protected from harsh environments.

SUMMARY OF THE INVENTION

A radar sensor is presented. In one embodiment, the radar sensor includes a first substrate and an integrated circuit coupled to the substrate. In some embodiments, the integrated circuit is configured to transmit and receive radio frequency (RF) signals. In some embodiments, an antenna may be coupled to the integrated circuit. In some embodiments, a lens may be coupled to the antenna.

In some embodiments, the lens antenna may be configured to enhance the gain of the of the sensor. In one embodiment, the lens may be fabricated from a superstrate. In one embodiment, the lens may enhance the gain through resonance. In some embodiments the antenna may also include an embedded ground plane coupled to the substrate. In some embodiments the embedded ground plane may be between the antenna and the feed line.

In some embodiments the substrate may include a low temperature co-fired ceramic (LTCC) material. The sensor may include several layers of LTCC material. In some embodiments the superstrate has a dielectric constant higher than the dielectric constant of the substrate and the superstrate may include a LTCC material. Also, the superstrate may employ CT765 tape system.

In some embodiments the substrate may include an LTCC material. In addition, the substrate may include CT707 material.

In some embodiments the antenna may be a fractal patch antenna. In some embodiments the antenna may be a fractal array. In addition, the superstrate may include a lens. Furthermore, the lens may include a multiple dielectric Fresnel lens. In some embodiments the lens may be a perforated Fresnel lens. In some embodiments the lens may include a Fresnel lens. The Fresnel lens may be a planar grooved Fresnel Zone plate lens.

In some embodiments the sensor may include an air gap between the antenna and the lens. Also, the air gap may be 2.4 mm thick.

In some embodiments, the substrate may include eight LTCC layers. In addition, a microstrip may be coupled to the integrated circuit, and the microstrip may be coupled to the antenna. In some embodiments, the ground plane may include at least one aperture configured to allow the antenna to be coupled to the microstrip.

A method for fabricating a radar sensor is also presented. In some embodiments, the method may include providing a first substrate. The method may also include providing an integrated circuit on the first substrate. In some embodiments, the integrated circuit is configured to transmit and receive RF signals.

In some embodiment the substrate comprises multiple layers. The bottom of the first layer may have the microstrip feed line fabricated on it. The method may include providing two layers on the top of the first layer. In some embodiment the top of the third layer may comprise the ground plane. The ground plane may comprise one or more apertures. In some embodiments the feed line couples to the apertures in the ground plane which in turn couples the antenna fabricated on the top of the eighth layer. The method may also include forming an air gap between the antenna and the lens. In some embodiment the air gap may be 2.4 mm.

In some embodiments, the method may include forming a lens in the superstrate. In some embodiments, the lens may include a Fresnel lens. Also, the lens may include a planar grooved Fresnel Zone plate lens.

In some embodiments, the step of forming the ground plane may include forming at least one aperture in the ground plane. In some embodiments, the first substrate may include LTCC material CT707. In some embodiments, the superstrate may include an LTCC material CT765. In some embodiments the antenna may include a fractal patch array.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

This disclosure presents a 24 GHz LTCC automotive radar SoP comprising an aperture coupled fractal antenna array on a relatively low dielectric constant LTCC substrate and a Fresnel lens realized in a high dielectric constant superstrate. Additionally, embodiments of a 77 GHz SoP are presented.

Figure 1A:
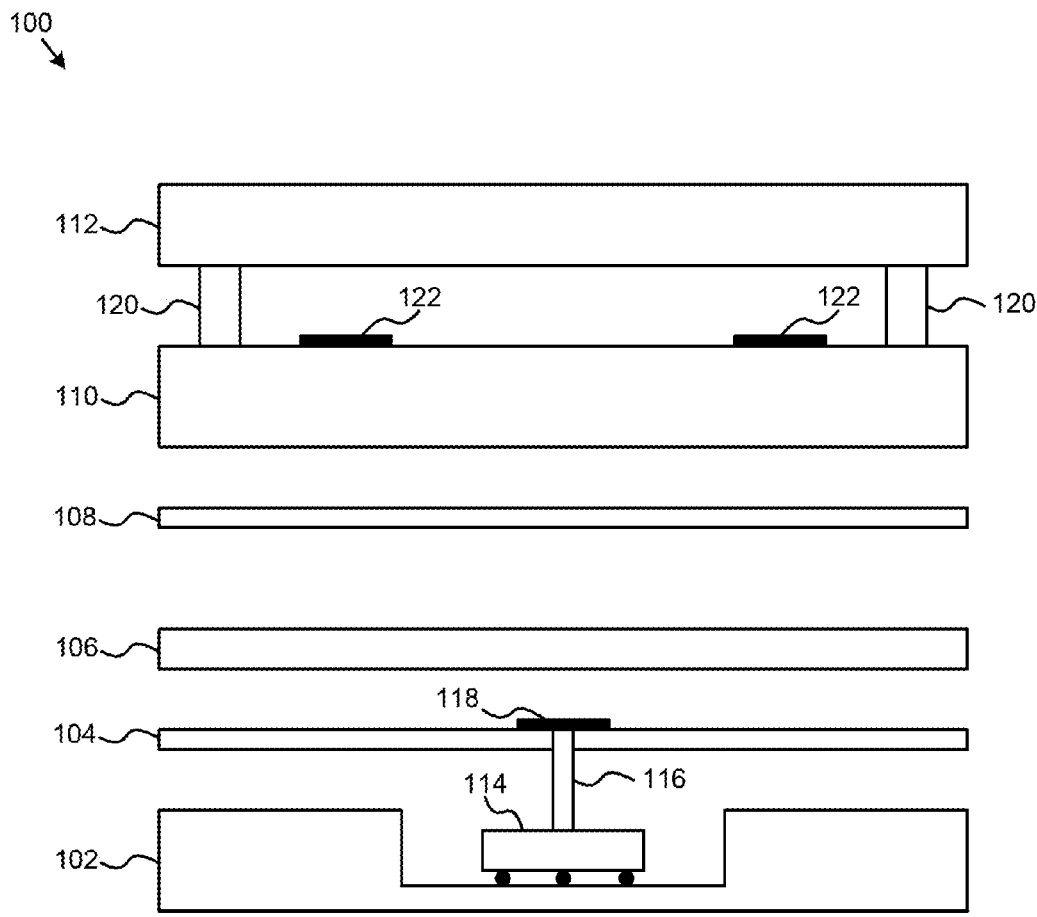
FIG. 1A is a schematic block diagram illustrating one embodiment of a radar sensor.

FIG. 1A illustrates one embodiment of a system 100 for a gain-enhanced low temperature co-fired ceramic SoP. The separate layers of the system 100 are shown spaced apart for clarity. In a working embodiment, the several layers would be pressed together into one compact package.

The first substrate 102 has a cavity in which an integrated circuit 114 resides. In this embodiment, the first substrate has a thickness of 0.5 mm. As shown by the solder balls, the integrated circuit may be soldered to the first substrate 102 to make electrical connections. The integrated circuit 114 may be connected by a via 116 to a microstrip feed line 118. The mictrostrip feed line 118 resides on a second substrate 104. In this embodiment the second substrate 104 is 0.1 mm thick. The second substrate 104 has the ability to encapsulate the integrated circuit 114, which may help protect the integrated circuit 114. The second 104 also provides a surface for the microstrip feed line 118. Coupled to the second substrate 104 is a third substrate 106. In this embodiment, the third substrate 106 is 0.3 mm thick. The third substrate 106 covers the second substrate and creates a separation between the microstrip feed line 118 and the ground plane 108. Although not shown, ground plane 108 has apertures that allow the microstrip feed line 118 to be RF coupled to the patch antennas 122. Coupled to the ground plane 108 is the fourth substrate 110. In this embodiment, the fourth substrate 110 is 0.5 mm thick. On top of the fourth substrate 110 is an array of patch antennas 122. In some embodiments, the patch antennas 122 may be fractal antennas.

The term fractal is used to explain a new geometry of shapes which can be defined as complex structures that have self-similarity. The fractals are composed of numerous small units of non-integer dimensions which stack up together to give rise to a complete structure which has the similar shape as that of the unit structure. This unique property of fractals has been exploited to develop antennas that are compact in size and have large bandwidths. The fractals can have multi-resonances; hence, provide greater bandwidths as compared to the conventional antennas. In addition to their larger bandwidths, fractal antennas are compact in size relative to the conventional antennas because of their efficient volume filling nature. The self affine and space filling properties of fractal antenna increases the effective electrical length of antenna to reduce the size of the antenna and hence, making them compact.

Coupled to the fourth substrate 110 are four posts 120. Only two posts 120 are shown in FIG. 1A; however, in this embodiment there is a post 120 in each corner of the system 100. The posts 120 may be made of the same material as the substrates. The posts allow the creation of an air gap between the fourth substrate and the lens 112. The air gap may increase the gain and robustness of the system 100 more than if the gap was filled with additional substrate. In this embodiment the air gap is 2.4 mm thick. Additionally, the lens 112 may further increase the gain while also providing the system 100 with additional protection against the environment.

The system 100 shown in FIG. 1A allows for an implementation of the gain resonance method using a LTCC medium. One or more of the substrates 102, 104, 106, 110 may be realized in a relatively low dielectric constant ($\in r1$) LTCC material, such as CT 707. The lens 112 may use a high dielectric constant ($\in r2$) LTCC material, such as CT 765. The material properties of both types of LTCC are listed in Table 1. In this embodiment, each layer's fired thickness is 100 µm. For example, the first substrate 102 is five layers thick (0.5 mm) with a four layer thick (0.4 mm) cavity to accommodate the integrated circuit 114. In some embodiments, the integrated circuit 114 is a Microwave and Millimeter-Wave Integrated circuit (MMIC). The MMIC is a flip-chip, which rests on the solder balls in the cavity. (Table 1 contains the right properties for CT 765.)

TABLE 1

|  | CT707 Material | CT765 Material |
| --- | --- | --- |
| Relative Dielectric Constant | 6.39 | 68.7 |
| Loss Tangent | 0.00481 | 0.00173 |
| Single Layer Thickness | 0.1 mm | 0.1 mm |

Figure 1B:
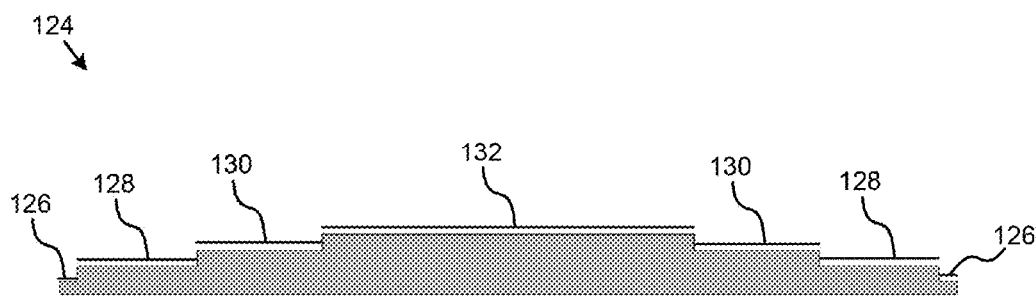
FIGS. 1B-C show one embodiment of a planar grooved Fresnel zone plate lens.

FIG. 1B shows one embodiment of a lens 112, which is a planar grooved Fresnel zone plate lens 124. In some embodiments, the lens may be a multiple dielectric lens. Compared to a multiple dielectric lens, the lens 124 may have a lower cost and may be easier to fabricate because there is no need to match the dielectric constants of different materials. The lens may also be a perforated Fresnel lens. Compared to a perforated Fresnel lens such, lens 124 may have a lower cost and a reduced size. However, a multiple dielectric lens and a perforated Fresnel lens may have a higher gain compared to a grooved Fresnel lens such as lens 124.

In some embodiments, lens 124 may be optimized for an operating frequency of 24 GHz, which has a free-space wavelength of 12.5 mm. In the embodiment shown, the grooves have the following dimensions. The first groove 126 has a length of 0.4722 mm. The second groove 128 has a length of 3.2174 mm. The third groove 130 has a length of 3.3339 mm. The top section 132 has a length of 9.953 mm. In this embodiment, the lens 124 is symmetrical, so that the grooves on one side are the same length as the grooves on the other. Each layer of the lens is 0.425 mm thick.

Figure 1C:
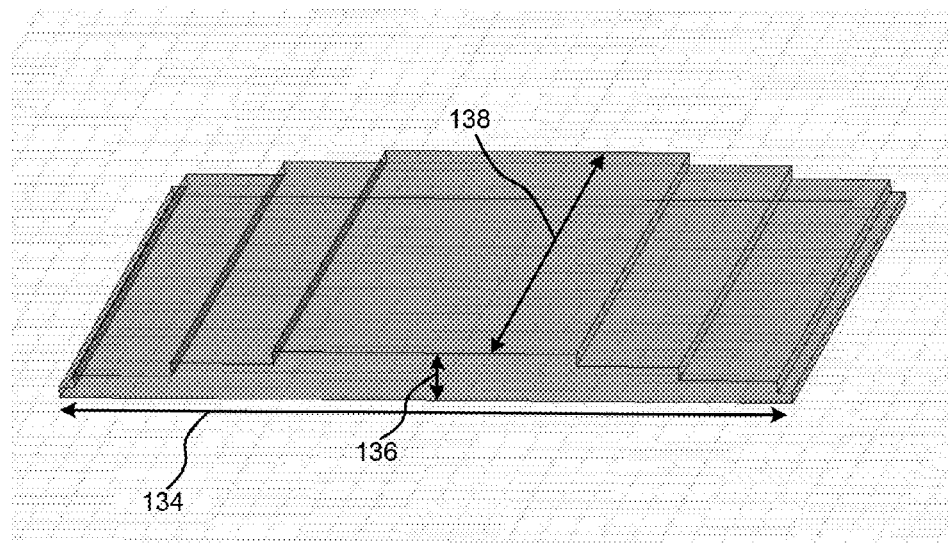

FIG. 1C shows the overall dimensions of the lens 124. In this embodiment, the lengths 134 and 138 of the lens are 24 mm. The height 136 of the lens is 1.615 mm, which can be made using nineteen 85 µm layers of LTCC material.

Figure 1D:
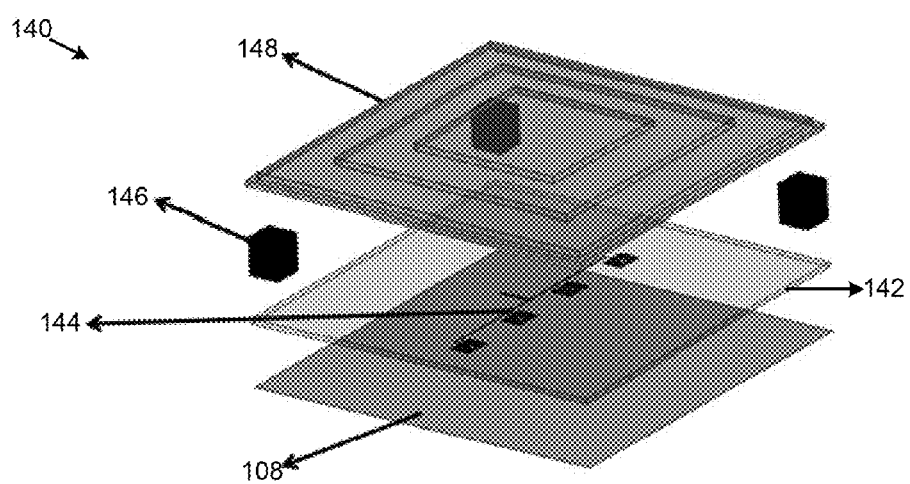
FIG. 1D is a schematic diagram illustrating an embodiment of a radar sensor SoP configured to operate at 77 GHz.

FIG. 1D illustrates another embodiment of a radar SoP 140. The described embodiment includes lens enhancements in both E and H plane of the feed antenna. The design may be optimized to operate at 77 GHz.

In this embodiment, the SoP 140 comprises a ground plane 108. The ground plane 108 may be oriented, for example, at a bottom side of the SoP 140. The SoP 140 may further include a plurality of LTCC substrates 142, 148. In a particular embodiment, the material of a first LTCC substrate 142 has a first dielectric constant. The material of a second LTCC substrate 148 may have a second dielectric constant. In one embodiment, the first dielectric constant is lower than the second dielectric constant.

In one embodiment, a patch antenna 144 may be formed on the first LTCC substrate 142. In a particular embodiment, the first LTCC substrate 142 may comprise a CT 707 material. The patch antenna 144 may comprise an array of radiant elements as shown in FIG. 1D. In a further embodiment, the patch antenna 144 may comprise a fractal patch antenna. Accordingly, the size of the radiant elements in the patch antenna 144 may be reduced. For example, in certain embodiments it has be observed that the fractal patch antenna elements may be 53% smaller than conventional patch antenna elements. Another benefit of the fractal patch antenna 144 is enhanced bandwidth. For example, in one embodiment, an 8% bandwidth has been observed, which is four times greater than that observed in a conventional patch antenna.

An aperture-coupled feed may be employed for the patch antenna 144. In particular, the fractal patch antenna 144 may be fed through one or more aperture-coupled slots in the ground plane 108 causing excitation of the radiant elements. In an alternative embodiment, the fractal patch antenna 144 may be fed through a microstrip inset feed. In a further embodiment, one or more integrated circuits and/or passive elements may be integrated with the fractal patch antenna 144 on the first LTCC substrate.

In one embodiment, the second LTCC substrate 148 may comprise a Fresnel lens. In a particular embodiment, the second LTCC substrate 148 may comprise a CT 765 material. In one embodiment, the first LTCC substrate 142 and the second LTCC substrate 148 may be integrated in a mixed LTCC tape system. In a particular embodiment, the Fresnel lens 148 may comprise a grooved Fresnel lens. For example, as shown in FIG. 1D, the lens grooves can be implemented on either side of the antenna array to enhance the gain in both the E-plane and the H-plane. One of ordinary skill in the art will recognize, however, that alternative lens configurations may be used with the present embodiments. In the depicted embodiments, the lens may increase the gain of the fractal patch antenna 144 by focusing or narrowing the electromagnetic energy beam radiated by the fractal patch antenna 144. This increased gain may also increase the communication range of the antenna.

The focal distance of the lens may be tuned by adjusting the size of an air gap between the fractal patch antenna 144 and the lens 148. For example, posts 146 may be used to set a desired air gap distance. In a particular embodiment, the air gap may be 2.4 mm. In a further embodiment, the posts may also comprise an LTCC material. As shown in Table II, the lens may be up to 84% smaller than typical dimensions of similar lenses of the prior art. Additionally, the thickness of the lens may be reduced by 89% as compared with typical lens thicknesses of the prior art.

TABLE II

| References | Centre Frequency (GHz) | Focal Length to Diameter (F/D) Ratio | Physical Dimensions (cm) | Thickness (mm) |
| --- | --- | --- | --- | --- |
| [1] | 30 | 0.5 | 15 | 15 |
| [2] | 30 | 0.5 | 15 | 15 |
| [3] | 30 | 0.25 | 19.4 | 16.8 |
| This Work | 24 | 0.1 | 2.4 | 1.6 |

Figure 2A:
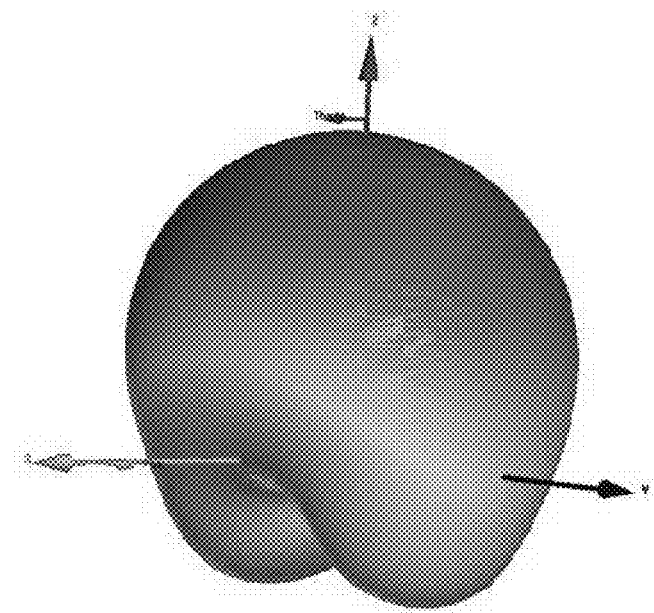
FIG. 2A is the radiation pattern of one embodiment of the single fractal patch antenna.
Figure 2B:
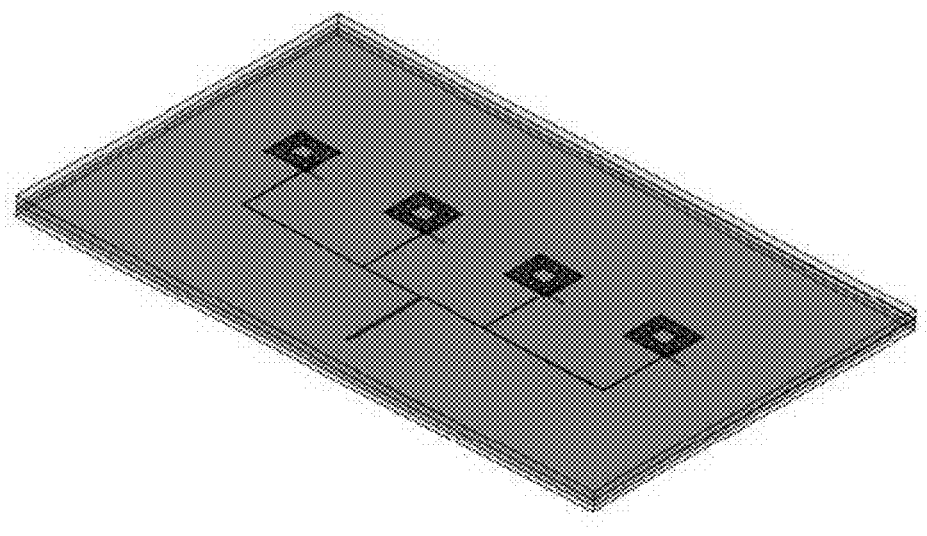
FIG. 2B is one embodiment of the fractal antenna array.

FIG. 2B shows one embodiment of an antenna array. The aperture coupled patch topology utilizes a common ground plane between the radiating antenna and the feed line. Aperture coupling may be employed because the ground plane in between the patch antenna array and the MMIC acts as a shield for the circuits. A limitation of this technique is that the aperture in the ground plane can radiate considerably in the backward direction. However, by choosing an appropriate aperture length with respect to the patch size can minimize this unwanted radiation.

Array designs are employed in order to increase the gain achieved from a single antenna element. In some embodiments, the higher the number of antenna elements in the array, the higher the overall gain. However, tradeoffs may include added complexity of the feed network, which may increase substrate losses and increase the size of the module because of the additional antenna elements. In the embodiment shown in FIG. 2B, the array comprises only four aperture coupled fractal patch antennas fed by a single microstrip split into four lines.

In some embodiments, a single fractal patch antenna element is designed for the required center frequency of 24 GHz. The antenna 122 is fed through the aperture in the ground plane, which in turn is fed through a microstrip feed line 118. The microstrip feed line 118 is excited through a lumped port in HFSS™ (high frequency structural simulator). In this embodiment, the width of the feed line is 0.2 mm, which corresponds to a characteristic impedance of 50Ω. The length of the aperture may play a vital role in determining the resonant frequency of the antenna and may also help in optimizing the input impedance of the antenna design. On the other hand, the aperture width may be critical in controlling the backward radiation from the antenna. In some embodiments, the aperture length and width are optimized to be 1.8 mm and 0.1 mm respectively. These dimensions may help achieve the desired radiation pattern with minimum backward radiation as shown in FIG. 2A. In some embodiments, the length of the fractal patch antenna is optimized to be 1.8 mm while its width is 1.8 mm. A good match with an S11 of −22 dB and a gain of 5.0 dB may be attained at 24 GHz.

Figure 3:
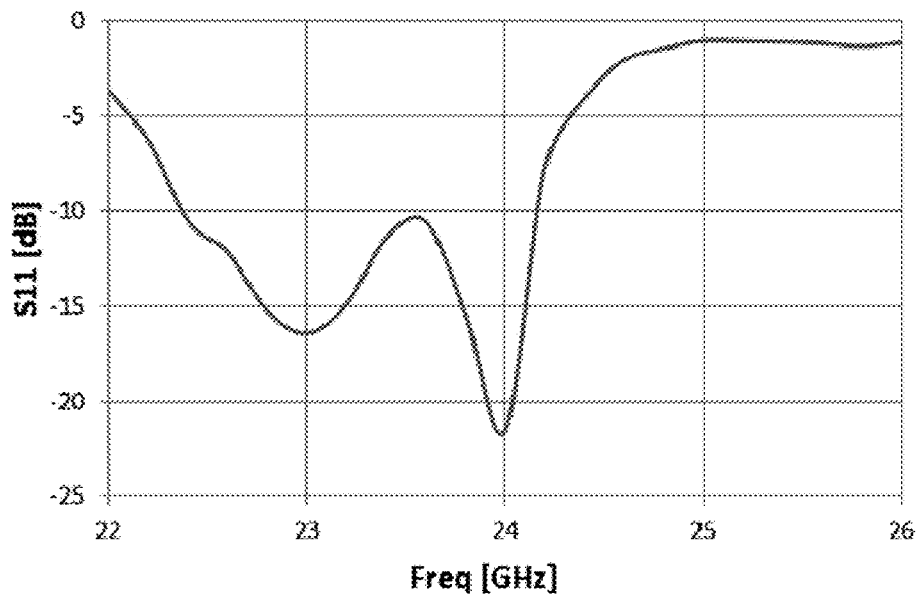
FIG. 3 is the graph showing the reflection coefficient of the antenna array.
Figure 4:
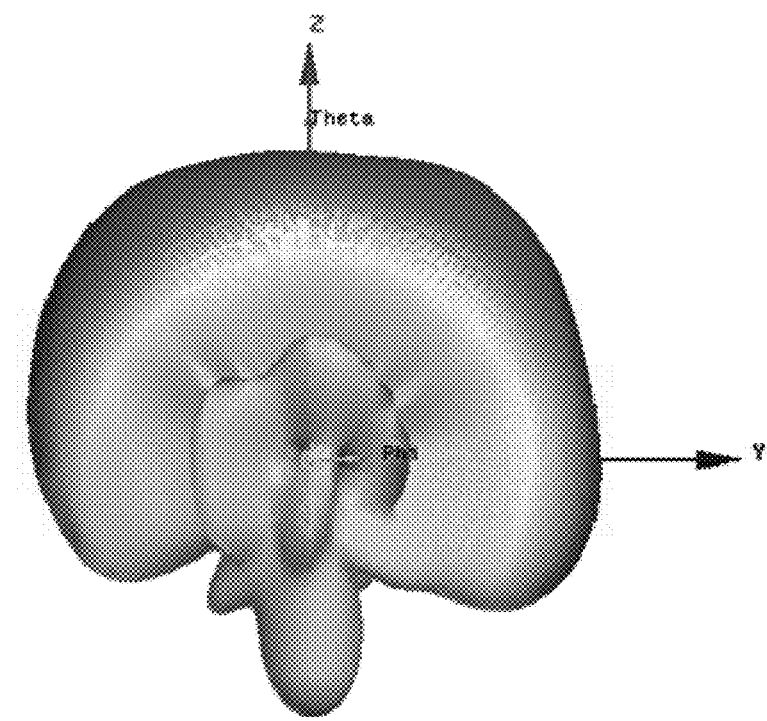
FIG. 4 is the radiation pattern of the fractal array.

As shown in FIG. 2B, in some embodiments each element in the antenna array is fed through a separate aperture in the ground plane, which in turn are excited through the microstrip lines divided in a T-fashion from the main microstrip feed line. The widths of these divided microstrip lines are 0.5 mm each and correspond to an impedance of 100Ω. The four 200Ω lines connected in parallel match perfectly to the 50Ω main feed line. In this embodiment, the antenna elements in the array have identical dimensions. The separation of 6 mm among the four fractal patch elements corresponds to half free space wavelength (0.5 λo). The reflection coefficient of the single element and the complete array are shown in FIG. 3. A good impedance match at 24 GHz is observed in both the cases. The gain of the array is 8.9 dB as compared to 5.0 dB of the single element. The radiation pattern of the array, as shown by the solid line in FIG. 4, has narrowed compared to the broad bore-sight lobe in case of single element represented by the dashed line. Moreover, the coupling between the four factal elements results in enhanced back lobe levels. However, these can be reduced, if required, by further optimizing the aperture dimensions. Similarly, due to the thick LTCC substrate the gain of the fractal LTCC array is slightly lower as the power is lost in surface waves. Higher gain can be achieved by replacing the thick substrate with thin LTCC layers having lower dielectric constant (close to air) as the antenna substrate.

In some embodiments, the gain enhancement technique employed is ideally suited to an LTCC environment, as it requires the addition of a superstrate layer over the substrate. This is referred to as the resonance gain method and utilizes a superstrate with either relative permittivity, $\in > 1$ or relative permeability, $\mu r > 1$. By choosing the layer thicknesses and antenna position properly, a very large gain may be realized at any desired angle. The gain varies proportionally to either $\in$ or $\mu r$, depending on the configuration. However, the bandwidth is seen to vary inversely to gain so that a reasonable gain limit may be actually established for practical antenna operation. The gain resonant condition for employing a $\in > 1$ superstrate is given as:

$$\frac{\eta_2 t}{\lambda_0} = \frac{2p-1}{4}$$

-continued $$\frac{\eta_1 z_0}{\lambda_0} = \frac{2n-1}{4}$$

$$\frac{\eta_1 B}{\lambda_0} = \frac{m}{2}$$

where η1 and η2 are the refractive indices of the substrate and superstrate respectively. B and t represent the thicknesses of the substrate and superstrate respectively. Here $z_0$ is the height of the antenna with respect to the bottom of the substrate, p, m and n are positive integers. For this design, the $\in r1$ of 6.39 and the $\in r2$ of 68.7 give η1 of 2.52 and η2 of 8.28 respectively. Choosing p=1 in (1) and calculating for 24 GHz, the required t=0.377 mm or 4 layers. Similarly, selecting n and m equal to 1, (2) and (3) give B=2.47 mm or 25 layers, and $z_0$=1.23 mm or 13 layers. Because 24 layers for the substrate may not be a cost effective solution, the substrate thickness may be restricted to the height required for locating the antenna, i.e. 1.3 mm or 13 layers. An air box may also be included between the substrate and superstrate and its thickness may be modeled through parametric simulations in HFSS™ to determine the highest gain.

Figure 5:
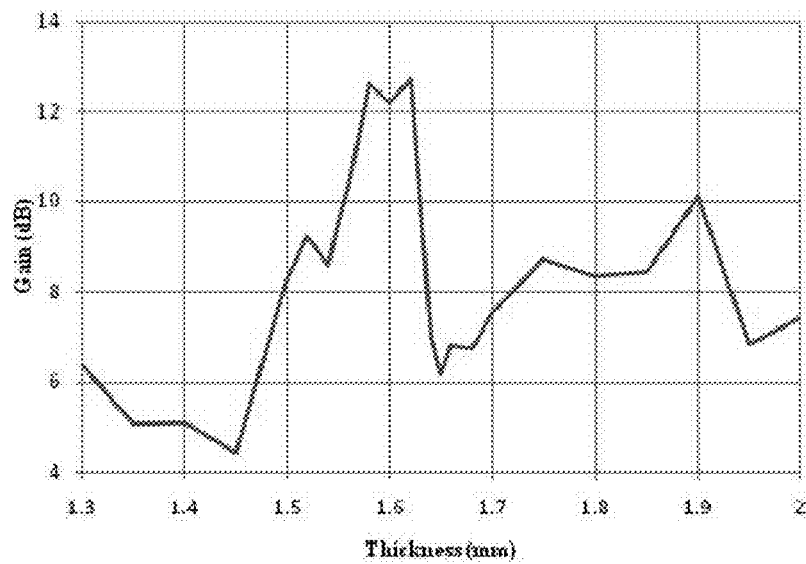
FIG. 5 shows the relationship between the gain and air gap between the lens and the antenna array.
Figure 6:
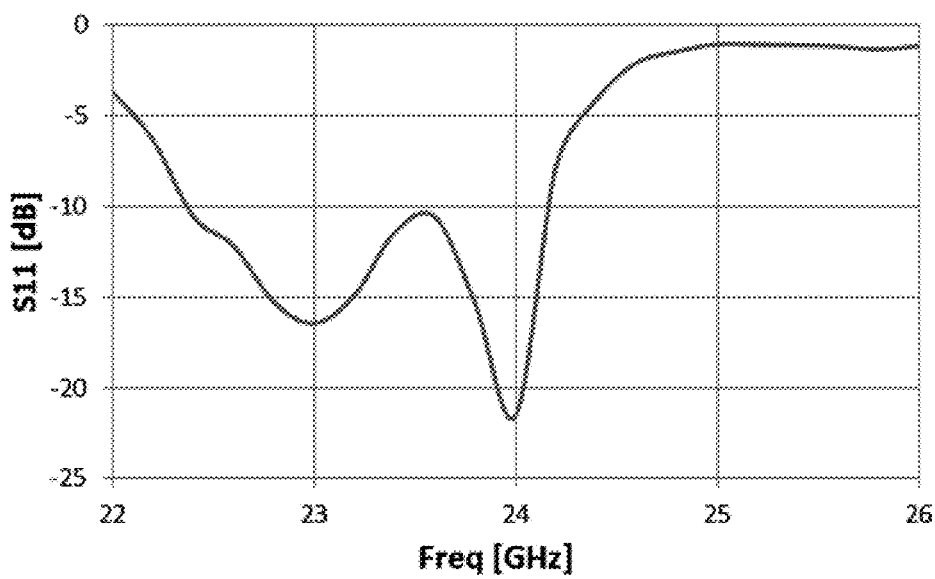
FIG. 6 shows the bandwidth characteristics of the fractal array with integrated Fresnel lens.
Figure 7:
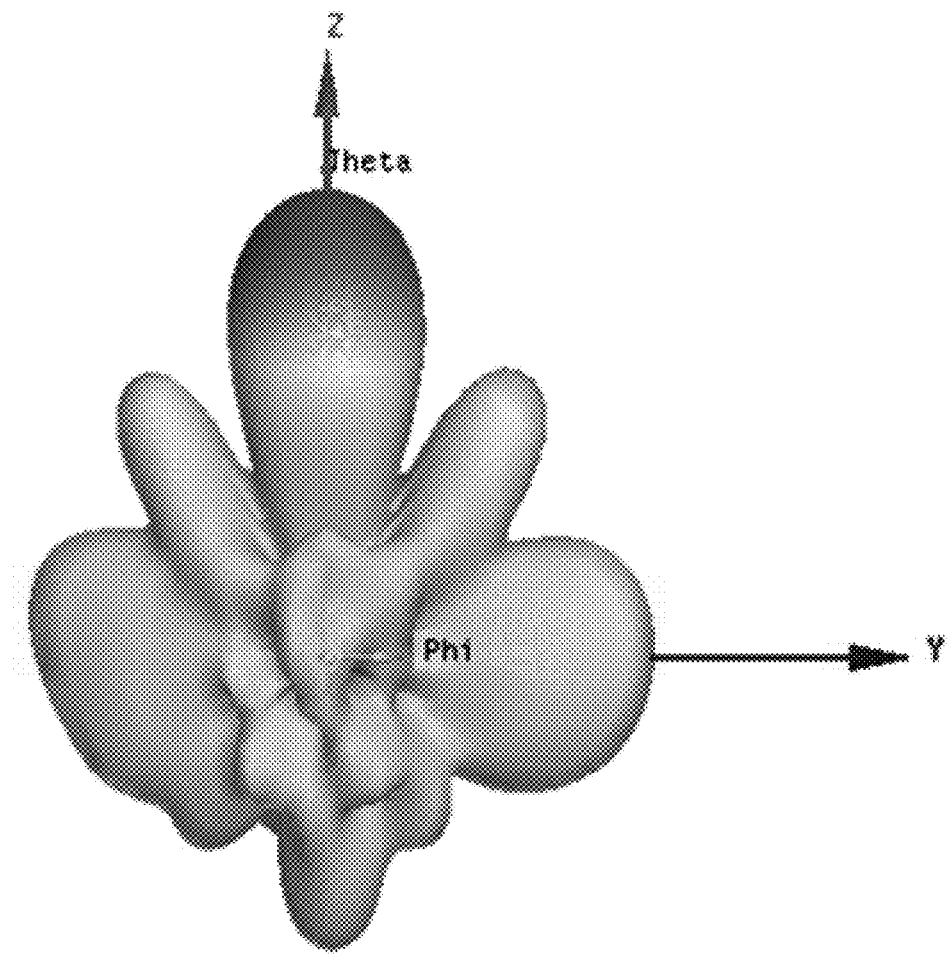
FIG. 7 is the radiation pattern of the antenna array with the lens.

As shown in FIG. 5, the superstrate may provide a gain enhancement of 6 dB at a height of 2.4 mm above the fractal patch antenna array. In this embodiment, the final gain with the array and the lens combination is 15 dB. Besides the increase in the gain, the radiation pattern of the array is also affected by the superstrate loading and now has higher side lobe levels. This means that in some embodiments the spacing between the elements has to be readjusted after loading of the superstrate. Though the impedance of the antenna array is not much influenced by the superstrate loading, however a downward shift may be observed in the 10 dB bandwidth. FIG. 6 shows the bandwidth of the array with the lens. The gain of the array and superstrate combination can be increased manifolds, provided the substrate thickness is increased. FIG. 7 shows the radiation pattern of an array with a lens fabricated using a superstrate.

In one example, the Friis transmission equation may be used to determine the range of the SoP module. In a typical automotive radar application, the transmitting power (Pt) from the transceiver is 10 dBm at the antenna port. The standard sensitivity of a typical receiver is around −100 dBm. Keeping into account the fading effect margin of 30 dB, let us assume the received power (Pr) is −70 dBm. Let us also consider that transmit and receive antennas are identical so the antenna gain for transmit (Gt) and receive (Gr) sides is 15 dB. The resonant frequency is 24 GHz, which corresponds to a free space wavelength λo of 12.5 mm. By substituting all these values in the Friis equation, the range can be calculated as follows:

$$P_r = P_t \times G_t \times G_r \times \left(\frac{\lambda_0}{4\pi R}\right)^2$$

In this example, the communication range achieved is quite suitable for the medium range automotive radar applications. The range can be enhanced, if required, by further increase in antenna gain or transmitted power.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 8:
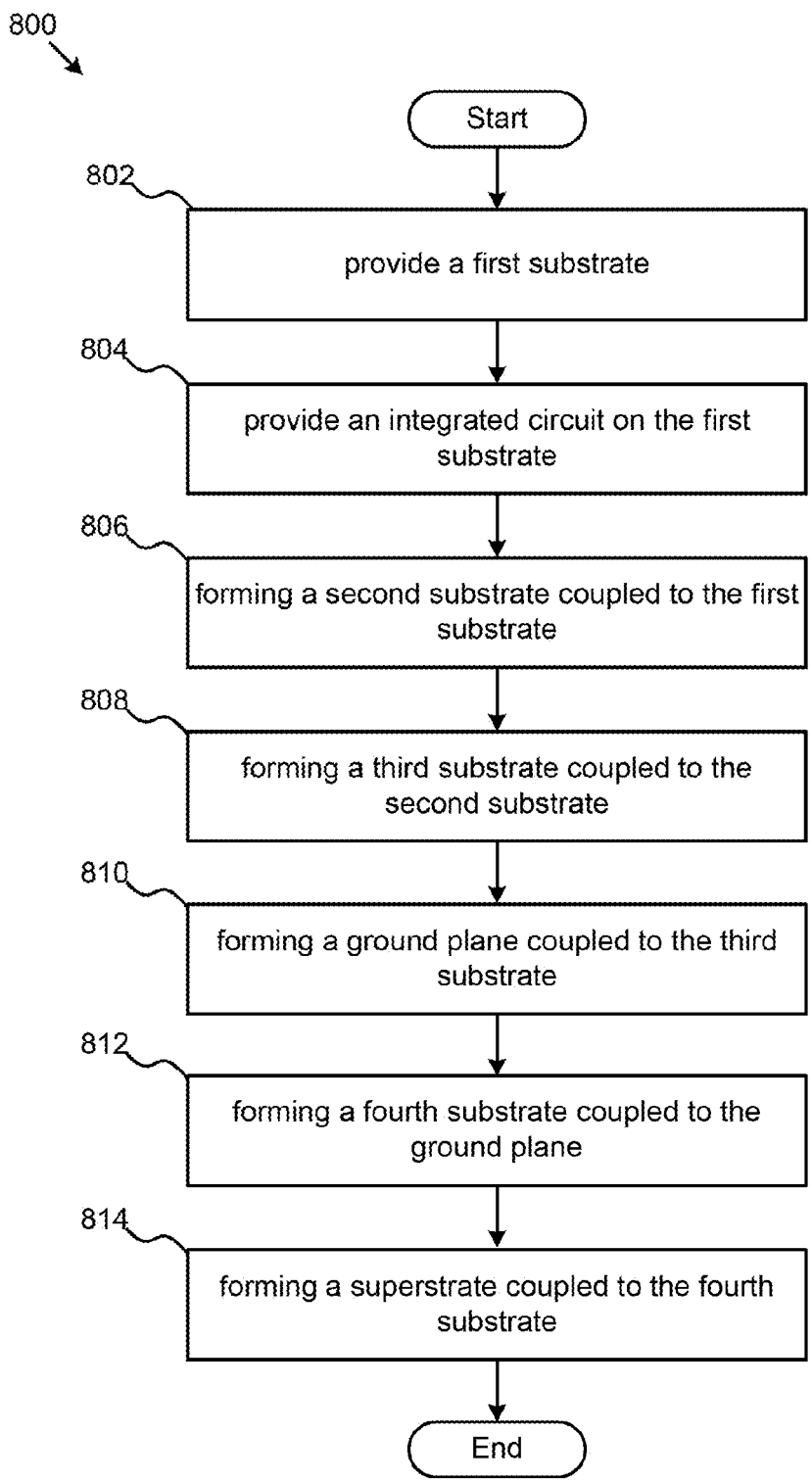
FIG. 8 is a schematic flow chart diagram illustrating one embodiment of a method for making a gain enhanced LTCC system-on-package for UMRR applications.

FIG. 8 illustrates one embodiment of a method 800 for fabricating a radar sensor. In one embodiment, the method 800 starts with providing a first substrate 802. The substrate may be made of LTCC material. The method may then include providing an integrated circuit on the first substrate 802. In some embodiments, the integrated circuit is configured to transmit and receive RF signals. The RF signals may be used to determine the distance to a surface. For example, the sensor may be mounted on a car and the sensor may be used to determine the distance to a car in front or behind. That distance may then be used for safety features such as automatic braking. In such applications, an increase is measurable distance may improve the safety by allowing the car more time to react to an obstacle.

The method may then include the step of forming a second substrate coupled to the first substrate 806. In some embodiments, the second substrate may include a microstrip feed line. The method may then continue with the step of forming a third substrate coupled to the second substrate 808. In some embodiments, the method may proceed to the step of forming a ground plane coupled to the third substrate 810. The ground plane may provide the advantage of shielding and increased signal to noise ratio, which may improve the performance of the system. The method may proceed to the step of forming a fourth substrate coupled to the ground plane 812. In some embodiments, the fourth substrate may include an antenna. The antenna may be a patch antenna, or it may be a fractal patch antenna. Fractal patch antennas can have higher bandwidth, which result in improved performance. Finally, the method may include the step of forming a superstrate coupled to the fourth substrate 814. The superstrate may have the combined benefit of increasing the gain of the system and providing for protection against harsh environments in a small package. In automotive applications, for example, the sensors may be subjected to environmental hazards such as debris from the road and flying objects such as insects. The superstrate may provide significant protection against these hazards while increasing the gain.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

REFERENCES

[1] I. Kadri, A. Petosa, L. Roy, "Ka-band Fresnel Lens Antenna Fed with an Active Linear Microstrip Patch Array", *IEEE Transactions on Antennas and Propagation*, Vol. 53, pp. 4175-4178, December 2005.

[2] A. Petosa, A. Ittipiboon, "Design and Performance of a Perforated Dielectric Fresnel Lens", *IEEE Proceedings-Microwaves, Antennas and Propagation*, vol. 148, pp. 309-314, October 2003.

[3] A. Petosa, A. Ittipiboon, "Shadow Blockage Effects on the Aperture Efficiency of Dielectric Fresnel Lens", *IEEE Proceedings-Microwaves, Antennas and Propagation*, Vol. 147, pp. 451-454, December 2000.

What is claimed is:

1. A radar sensor comprising:
a first substrate comprising a cavity on a first side of the first substrate;
an integrated circuit coupled to the first substrate in the cavity, where the integrated circuit is configured to transmit and receive radio frequency (RF) signals;
a second substrate disposed on the first side of the first substrate, the second substrate covering the integrated circuit in the cavity;
a microstrip disposed on a side of the second substrate that is opposite the first side of the first substrate, the microstrip coupled to the integrated circuit through the second substrate;
an antenna wirelessly coupled to the microstrip via an aperture through a ground plane disposed between the microstrip and the antenna; and
a superstrate coupled to the antenna.

2. The radar sensor of claim 1, where the superstrate is configured to enhance gain of the sensor.

3. The radar sensor of claim 2, where the superstrate is configured to enhance the gain through resonance.

4. The radar sensor of claim 1, where the ground plane is coupled to the first substrate.

5. The radar sensor of claim 4, where the ground plane comprises one or more apertures.

6. The radar sensor of claim 1, where the first substrate comprises a low temperature co-fired ceramic (LTCC) material.

7. The radar sensor of claim 1, where the superstrate has a dielectric constant greater than ten times higher than a dielectric constant of the first substrate.

8. The radar sensor of claim 1, where the superstrate comprises an LTCC material.

9. The radar sensor of claim 1, where the superstrate further comprises CT765 material.

10. The radar sensor of claim 1, where the first substrate comprises a plurality of LTCC layers.

11. The radar sensor of claim 1, where the first substrate comprises CT707 material.

12. The radar sensor of claim 1, where the antenna is a fractal patch antenna.

13. The radar sensor of claim 1, where the antenna comprises a fractal array.

14. The radar sensor of claim 1, where the superstrate comprises a lens.

15. The radar sensor of claim 14, where the lens comprises a multiple dielectric Fresnel lens.

16. The radar sensor of claim 14, where the lens comprises a perforated Fresnel lens.

17. The radar sensor of claim 14, where the lens comprises a Fresnel lens.

18. The radar sensor of claim 17, where the Fresnel lens is a planar grooved Fresnel zone plate lens.

19. The radar sensor of claim 1, further comprising an air gap between the antenna and the superstrate.

20. The radar sensor of claim 19, where the air gap is 0.4 mm thick.

21. The radar sensor of claim 1, where the first substrate comprises five LTCC layers.

22. The radar sensor of claim 1, where the microstrip is wirelessly coupled to the antenna through a third substrate disposed between the aperture and the antenna.

23. The radar sensor of claim 1, where the ground plane comprises a plurality of apertures configured to allow the antenna to be wirelessly coupled to the microstrip.

24. A method for fabricating a radar sensor, the method comprising:
providing a first substrate;
providing an integrated circuit on the first substrate, where the integrated circuit is configured to transmit and receive RF signals;
forming a second substrate coupled to the first substrate, where the second substrate comprises a microstrip feed line coupled to the integrated circuit, the microstrip feed line disposed on a side of the second substrate opposite the first substrate;
forming a third substrate coupled to the second substrate on a side opposite the first substrate;
forming a ground plane coupled to the third substrate on a side opposite the second substrate;
forming a fourth substrate coupled to the ground plane on a side opposite the third substrate, where the fourth substrate comprises an antenna configured to wirelessly couple to the microstrip feed line via an aperture in the ground plane; and
forming a superstrate coupled to the fourth substrate.

25. The method of claim 24, wherein the method comprises forming an air gap between the fourth substrate and the superstrate.

26. The method of claim 25, where the air gap is 0.4 mm thick.

27. The method of claim 24, further comprising forming a lens in the superstrate.

28. The method of claim 27, where the lens further comprises a Fresnel lens.

29. The method of claim 27, where the lens further comprises a planar grooved Fresnel Zone plate lens.

30. The method of claim 24, where forming the ground plane further comprises forming the aperture in the ground plane.

31. The method of claim 24, where the first substrate comprises LTCC material CT707.

32. The method of claim 24, where the superstrate comprises LTCC material CT765.

33. The method of claim 24, where the antenna comprises a fractal patch array.

34. A radar sensor comprising:
a first low temperature co-fired ceramic (LTCC) substrate formed of a first LTCC material having a first dielectric constant;
a second LTCC substrate formed of a second LTCC material having a second dielectric constant, wherein the first dielectric constant is greater than ten times lower than the second dielectric constant;
a fractal antenna array formed on the first LTCC substrate;
an aperture-coupled feed that is wirelessly coupled to the fractal antenna array through the first LTCC material of the first LTCC substrate; and
the second LTCC substrate comprising a Fresnel lens spaced apart from the fractal antenna array, and configured to focus energy emitted by the fractal antenna array.

35. The radar sensor of claim 34, wherein the first LTCC substrate comprises a CT707 material.

36. The radar sensor of claim 34, wherein the second LTCC substrate comprises a CT 765 material.

37. The radar sensor of claim 34, wherein the first LTCC substrate and the second LTCC substrate comprise a mixed LTCC tape system.

38. The radar sensor of claim 34, further comprising an integrated circuit formed on the first LTCC substrate.

39. The radar sensor of claim 34, further comprising one or more passive elements formed on the first LTCC substrate.

40. The radar sensor of claim 34, wherein the aperture-coupled feed comprises one or more slots in a ground plane to wirelessly couple to the fractal antenna array, the ground plane formed on a side of the first LTCC substrate that is opposite the fractal antenna array.

41. The radar sensor of claim 34, having a total thickness of between 4.5 and 5 mm.

42. The radar sensor of claim 34, having a length and a width of 2.0-3.0 cm.

43. The radar sensor of claim 34, configured to operate at a center frequency of 24 GHz.

44. The radar sensor of claim 34, configured to operate at a center frequency of 77 GHz.

45. The radar sensor of claim 34, having a focal length to diameter (F/D) ratio of 0.1.

46. The radar sensor of claim 34, further comprising an air gap between the fractal antenna and the Fresnel lens.

47. The radar sensor of claim 46, wherein the air gap is 2.4 mm.

48. The radar sensor of claim 46, wherein a distance of the air gap is set by one or more LTCC posts.

49. The radar sensor of claim 34, wherein the Fresnel lens comprises a plurality of linear or rectangular grooves.

50. The radar sensor of claim 49, wherein the plurality of rectangular grooves are disposed in a step-wise fashion about the Fresnel lens and configured to enhance gain in both an E-plane and a H-plane.

\* \* \* \* \*